United States Patent
Kloetzig et al.

(10) Patent No.: US 12,156,385 B2
(45) Date of Patent: Nov. 26, 2024

(54) ELECTRONIC ASSEMBLY

(71) Applicant: Robert Bosch GmbH, Stuttgart (DE)

(72) Inventors: Rene Kloetzig, Reutlingen (DE); Thomas Maerz, Metzingen (DE)

(73) Assignee: Robert Bosch GmbH, Stuttgart (DE)

( * ) Notice: Subject to any disclaimer, the term of this patent is extended or adjusted under 35 U.S.C. 154(b) by 199 days.

(21) Appl. No.: 18/013,084

(22) PCT Filed: Jun. 9, 2021

(86) PCT No.: PCT/EP2021/065465
§ 371 (c)(1),
(2) Date: Dec. 27, 2022

(87) PCT Pub. No.: WO2021/259639
PCT Pub. Date: Dec. 30, 2021

(65) Prior Publication Data
US 2023/0255004 A1    Aug. 10, 2023

(30) Foreign Application Priority Data
Jun. 25, 2020   (DE) .................... 10 2020 207 871.8

(51) Int. Cl.
*H05K 7/20* (2006.01)
*H05K 5/00* (2006.01)
*H01R 12/58* (2011.01)

(52) U.S. Cl.
CPC ....... *H05K 7/20845* (2013.01); *H05K 5/0069* (2013.01); *H01R 12/58* (2013.01)

(58) Field of Classification Search
CPC ... H05K 7/20845; H05K 5/0069; H01R 12/58
(Continued)

(56) References Cited

U.S. PATENT DOCUMENTS

| | | | |
|---|---|---|---|
| 2010/0202110 A1 | 8/2010 | Becker et al. | |
| 2010/0267252 A1* | 10/2010 | Fujimoto | H01G 9/10 439/825 |

(Continued)

FOREIGN PATENT DOCUMENTS

| | | |
|---|---|---|
| CN | 101483982 A | 7/2009 |
| CN | 108806505 A | 11/2018 |

(Continued)

OTHER PUBLICATIONS

Translation of International Search Report for Application No. PCT/EP2021/065465 dated Sep. 17, 2021 (2 pages).

*Primary Examiner* — Andargie M Aychillhum
(74) *Attorney, Agent, or Firm* — Michael Best & Friedrich LLP

(57) ABSTRACT

The present invention relates to an electronic assembly (1) comprising: a base plate (2); an electronic component (3) having a plurality of pins (30) which each extend parallel to a press-in axis (4); a printed circuit board (5) which is pressed onto the pins (30) along the press-in axis (4); a cooling region (6) which is formed between the electronic component (3) and the base plate (2); and a sealing arrangement (7) which is located between the base plate (2) and the electronic component (3) and is designed to seal the cooling region (6), wherein the sealing arrangement (7) has a seal support (71) and at least one seal (72), the seal support (71) has a plurality of press-in domes (75) projecting parallel to the press-in axis (4), and the electronic component (3) is supported by means of the press-in domes (75) of the seal support (71) in order to absorb a press-on force (40) when the printed circuit board (5) is pressed onto the pins (30).

20 Claims, 2 Drawing Sheets

(58) Field of Classification Search
USPC .......................................................... 361/760
See application file for complete search history.

(56) References Cited

U.S. PATENT DOCUMENTS

| | | |
|---|---|---|
| 2013/0255925 A1 | 10/2013 | Koontz et al. |
| 2015/0009634 A1* | 1/2015 | Hsu .......................... H05K 7/14 |
| | | 361/748 |
| 2015/0180156 A1 | 6/2015 | Endo et al. |
| 2021/0210880 A1 | 7/2021 | Fukakusa et al. |

FOREIGN PATENT DOCUMENTS

| | | |
|---|---|---|
| CN | 109586098 A | 4/2019 |
| DE | 10205818 A1 | 8/2003 |
| DE | 102012213573 B3 | 9/2013 |
| DE | 102014216170 B3 | 12/2015 |
| DE | 102017220278 A1 | 5/2019 |
| DE | 102018115515 A1 | 1/2020 |
| EP | 2429273 A2 | 3/2012 |
| EP | 2988329 A1 | 2/2016 |
| EP | 3270666 A1 | 1/2018 |
| FR | 2978872 A1 | 2/2013 |
| JP | H1022428 A | 1/1998 |
| JP | 2014171276 A | 9/2014 |
| JP | 2014241323 A | 12/2014 |
| JP | 2017215249 A | 12/2017 |
| WO | 2014023460 A1 | 2/2014 |

* cited by examiner

ELECTRONIC ASSEMBLY

BACKGROUND OF THE INVENTION

The present invention relates to an electronic arrangement. The invention further relates to a control unit and a method for assembling an electronic arrangement.

Electronic arrangements are known, in which printed circuit boards are mounted on a plurality of pins. The connection between the printed circuit board and pins is conventionally realized by soldering or by means of a press connection. To produce a press connection, it is necessary to support the pins, or the device holding the pins. In this case, depending on the configuration and/or sequence for assembling the electronic arrangement, adequate support often cannot be provided during the pressing-on procedure, or it can only be provided to a limited extent.

SUMMARY OF THE INVENTION

The inventive electronic arrangement offers the advantage of a very simple and cost-effective construction, which enables reliable and effective mechanical support during the pressing-on of a printed circuit board. According to the invention, this is achieved by an electronic arrangement comprising a base plate, an electronic component, a printed circuit board, a cooling region and a seal arrangement. The base plate is preferably provided for holding the further elements. For example, the base plate may be designed to enable the elements to be fastened in or on a housing. Furthermore, the base plate may provide a means of absorbing a mechanical load. In this case, the electronic component has a plurality of pins, which each extend parallel to a press-in axis. In this case, the electronic component may be designed in a variety of ways. For example, the electronic component may have one or more electronic elements, for example an inverter.

The printed circuit board is pressed onto the pins along the press-in axis. In particular, a press connection is therefore established between the printed circuit board and the pins.

The seal arrangement is arranged between the base plate and the electronic component, in particular along a direction of the press-in axis. In this case, the seal arrangement has a seal carrier and at least one seal. The seal arrangement is provided in order to seal the cooling region, which is located between the electronic component and the base plate. For example, the seal may be an elastomer seal, e.g. an O-ring seal. The seal is preferably at least partly received in the seal carrier. For example, the seal carrier may have a ring groove in which the seal is partly received.

In this case, the seal carrier has a plurality of press-in domes protruding parallel to the press-in axis. The electronic component is supported by means of the press-in domes here in order to absorb a press-on force when the printed circuit board is pressed onto the pins. In this case, the press-in domes may be envisaged as pin- or nipple-like elevations in the seal carrier, which protrude from a base body of the seal carrier and thus form a reduced bearing surface for an adjoining component. In this case, the press-in domes preferably protrude slightly—in particular by maximally 5 mm, preferably at least 0.5 mm—from a surface of the seal carrier which surrounds the press-in domes.

The cooling region is preferably designed to receive a coolant. The cooling region, in particular with coolant, may be provided in order to enable cooling of the electronic component. In particular, the cooling region in this case may be regarded as a gap between the electronic component and the base plate. Since the electronic component cannot be directly supported during the pressing-on of the printed circuit board due to the cooling region, the indirect support by means of the press-in domes of the seal carrier particularly advantageously enables the printed circuit board to be pressed on in a precise manner and with little effort, without damaging parts of the electronic arrangement.

The press-in domes of the seal carrier form an indirect support for the electronic component on the base plate. This means that, when pressing the printed circuit board onto the pins, an opposite holding force may be provided at or by means of the base plate, preferably by means of a counter-holding force opposing the press-on force. In this case, the press-on force of the electronic component may be conducted into the base plate by the seal carrier, wherein the press-in domes form part of the force-transfer path. In particular, the press-in domes in this case are provided to prevent damage to the seal, for example as a result of too great a compression due to the press-on force. Moreover, a special configuration of the press-in domes enables an optimum and specific distribution of the mechanical loads during the pressing-on of the printed circuit board in order to prevent damage to the electronic arrangement. Furthermore, a specifically configured support enables a desired press-on force to be particularly specifically and precisely realized during the pressing-on of the printed circuit board in order to produce a reliable, durable and easily produced press connection between the printed circuit board and pins, which can be reproduced easily and with no, or only slight, deviations.

The electronic arrangement preferably further comprises a holding plate, which is connected to the base plate. In this case, the holding plate pre-tensions the electronic component in the direction of the base plate. The holding plate is preferably connected to the base plate by means of a screw connection. In particular, the holding plate therefore enables a pre-tensioning of the combination comprising the electronic component, base plate and seal arrangement. In this case, the press-in domes are preferably elastically deformed as a result of the connection between the holding plate and base plate. This means that, by bracing the holding plate and the base plate, the electronic component and the seal carrier are clamped between the holding plate and base plate such that the press-in domes are elastically deformed. By preference, only the press-in domes undergo an elastic deformation here. In addition to the elastic deformation of the press-in domes, it may preferably be provided that the press-in domes are plastically deformed as a result of the bracing action. It is thus ensured that a reliable sealing function of the seal is maintained along with an optimum supporting effect. Furthermore, the seal is consequently preferably slightly compressed in order to provide direct support, i.e. without the seal yielding elastically. The printed circuit board may thus be pressed onto the pins with a desired press-on force in a particularly accurate and precise manner.

The holding plate is particularly preferably arranged on a side of a sub-region of the electronic component which is opposite the base plate. Furthermore, the holding plate is connected to a contact device of the base plate which protrudes parallel to the press-in axis. In this case, the holding plate and the contact device are connected to one another in an abutting manner. Particularly simple assembly of the electronic arrangement, in particular in preparation for the pressing-on of the printed circuit board, may thus be enabled by simply bracing the holding plate and the base plate until they come to a stop, so that the holding plate abuts against the contact device. For a particularly simple and cost-effective construction, the holding plate in this case may be designed as a ring-like plate, wherein a radially inner region of the holding plate abuts against a radially outer flange region of the electronic component. In particular, in this case, a radially outer region of the holding plate may be in contact with the contact device of the base plate, wherein the contact device preferably protrudes in the direction of the electronic component. Alternatively, the holding plate may be formed as multiple parts, for example in the form of a plurality of individual plates, which can each be separately braced with the base plate and are each in contact with a separate sub-region of the electronic component. The holding plate may preferably be connected to the contact device by means of a screw connection for particularly simple, cost-effective construction and production.

The press-in domes are preferably configured such that a sum of a first restoring force, which corresponds to a sum of restoring forces of all press-in domes, and a second restoring force of the seal is greater than or equal to the predetermined press-on force with which the printed circuit board is pressed onto the pins. The seal arrangement is thus prevented from yielding during the pressing-on of the printed circuit board. As a result of such a configuration, optimum support of the electronic component is ensured in order to enable a precise and reliable press connection to be produced between the printed circuit board and pins. In this case, the predetermined press-on force is preferably at least 70 N, and in particular maximally 150 N, per pin. In this case, the first elastic restoring force is preferably significantly greater than the second elastic restoring force. By preference, a value of the first elastic restoring force is at least 80%, particularly preferably at least 95%, of the predetermined press-on force.

The seal carrier and the seal preferably surround the cooling region in a ring-like manner in order to provide the sealing of the cooling region between the electronic component and the base plate. A large volume of the cooling region may thus be provided for an optimum cooling effect.

The seal arrangement preferably has two seals in order to enable particularly reliable sealing of the cooling region. In this case, a first seal is arranged between the seal carrier and the electronic component and a second seal is arranged between the seal carrier and the base plate. In this case, the seal carrier preferably has, on each of the opposing sides along a direction of the press-in axis, a ring groove in which the seals are arranged. In particular, the seal carrier has an H-like cross section in a cross-sectional plane parallel to the press-in axis.

Multiple press-in domes are particularly preferably grouped together in each case to form press-in dome groups. In this case, multiple such press-in dome groups are arranged distributed around the circumference of the seal carrier. A press-in dome group is envisaged as a predefined number of press-in domes which are arranged near to one another. By preference, a first spacing between adjacent press-in dome groups is at least three times, preferably at least ten times, the spacing between adjacent press-in domes within a press-in dome group. A particularly specific force distribution on the seal carrier during the pressing-on of the printed circuit board may thus be enabled, along with a space- and material-saving construction of the seal carrier.

Each press-in dome group particularly preferably has at least two, by preference maximally ten, in particular three, press-in domes. In this case, the seal carrier preferably has at least four, particularly preferably maximally twelve, in particular eight, press-in dome groups.

By preference, each press-in dome has a length to width ratio of at least one, preferably maximally five, in particular two. In this case, the length to width ratio is seen in a cross-sectional plane perpendicular to the press-in axis. The length preferably corresponds to a dimension of the press-in dome substantially along a circumferential direction of the seal carrier, the width corresponding to a dimension of the press-in dome substantially in the radial direction of the seal carrier, in particular perpendicularly to the length. In this case, each press-in dome particularly preferably has a rectangular or oval cross section in the cross-sectional plane. It is thus possible for the mechanical loads to be optimally absorbed with a low spatial requirement.

The seal carrier is preferably made of plastic material, in particular of a thermoplastic material, particularly preferably polyphenylene sulfide. It is thus possible to provide optimum mechanical properties of the seal carrier with simple and cost-effective producibility, in particular using an injection molding technique.

The press-in domes are particularly preferably arranged facing the electronic component on the seal carrier. This means that the electronic component abuts against the press-in domes during the pressing-on of the printed circuit board. As a result, only a small contact surface is established between the electronic component and the seal carrier, namely at the press-in domes, so that the heat transfer from the electronic component to the seal carrier is kept low, for example.

Furthermore, the invention results in a control unit which comprises the described electronic arrangement. The control unit is preferably a control unit of a vehicle, for example an engine control unit, in particular of a motor vehicle.

The invention further relates to a method for assembling an electronic arrangement, in particular the described electronic arrangement. The method comprises the following steps, which are preferably implemented successively in the sequence described below:

providing a seal arrangement having a seal carrier and at least one seal;

arranging the seal arrangement on a base plate, arranging an electronic component on a side of the seal arrangement which is opposite the base plate, pressing a printed circuit board onto a plurality of pins of the electronic component along a press-in axis, wherein the seal carrier has a plurality of press-in domes protruding parallel to the press-in axis, and wherein the press-in domes support the electronic component during the pressing-on of the printed circuit board in order to absorb a press-on force.

The method in this case is notable in that it can be carried out in a particularly simple and time-efficient manner. Moreover, established operating means, such as pressing apparatus, may be used without the need for special adaptation.

The method preferably further comprises the steps:

arranging a holding plate on a side of the electronic component which is opposite the seal carrier; and pre-tensioning the electronic component against the base plate by means of the holding plate.

In this case, these steps are carried out prior to the pressing-on of the printed circuit board. By means of the holding plate, the electronic component is pre-tensioned against the base plate here via the seal carrier with the press-in domes. The holding plate is preferably connected to the base plate by means of a screw connection for pre-tensioning purposes. Particularly simple and accurate handling of the electronic arrangement during assembly may thus be achieved since the relative arrangement of the individual elements may be precisely aligned and fixed by the pre-tensioning procedure, for example.

The electronic component is particularly preferably pre-tensioned against the base plate by means of the holding plate in such a way that the press-in domes of the seal carrier are deformed. In particular, in this case, the press-in domes may be elastically and/or plastically deformed. By preference, only the press-in domes undergo a deformation here. It may thus be ensured that the printed circuit board may be pressed onto the pins in a particularly accurate and precise manner with a desired press-on force, in particular without an undesired yielding of further elements having an influence on the press connection.

BRIEF DESCRIPTION OF THE DRAWINGS

A preferred exemplary embodiment of the invention is described in detail below with reference to the accompanying drawing. Similar or functionally similar elements are always denoted by the same reference signs. In the drawing.

DETAILED DESCRIPTION

Figure 1:
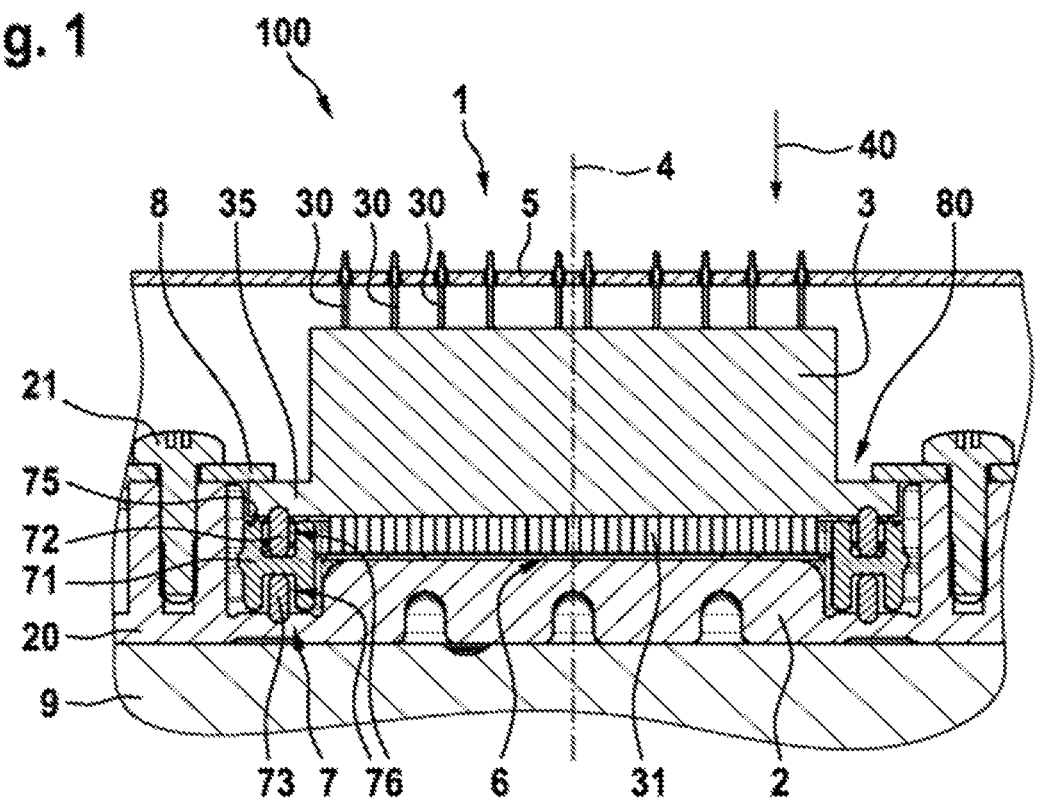
FIG. 1 shows a sectional view of a control unit with an electronic arrangement according to a preferred exemplary embodiment of the invention.
Figure 2:
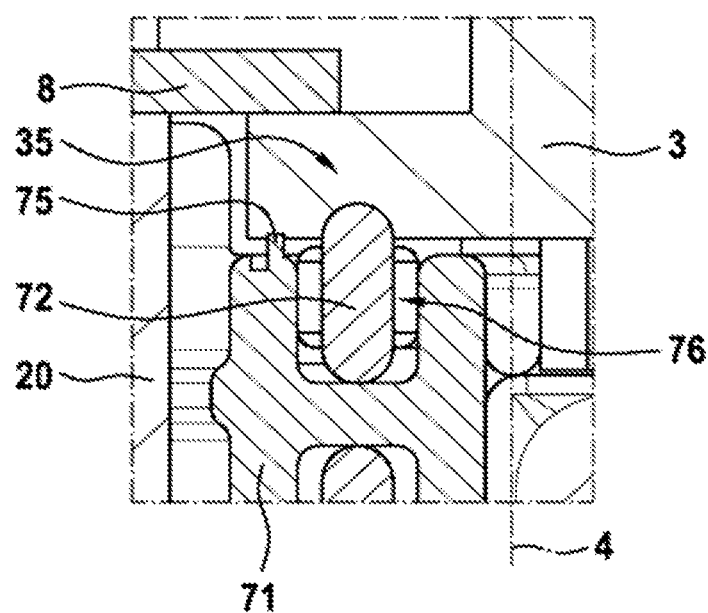
FIG. 2 shows a detail of FIG. 1.
Figure 3:
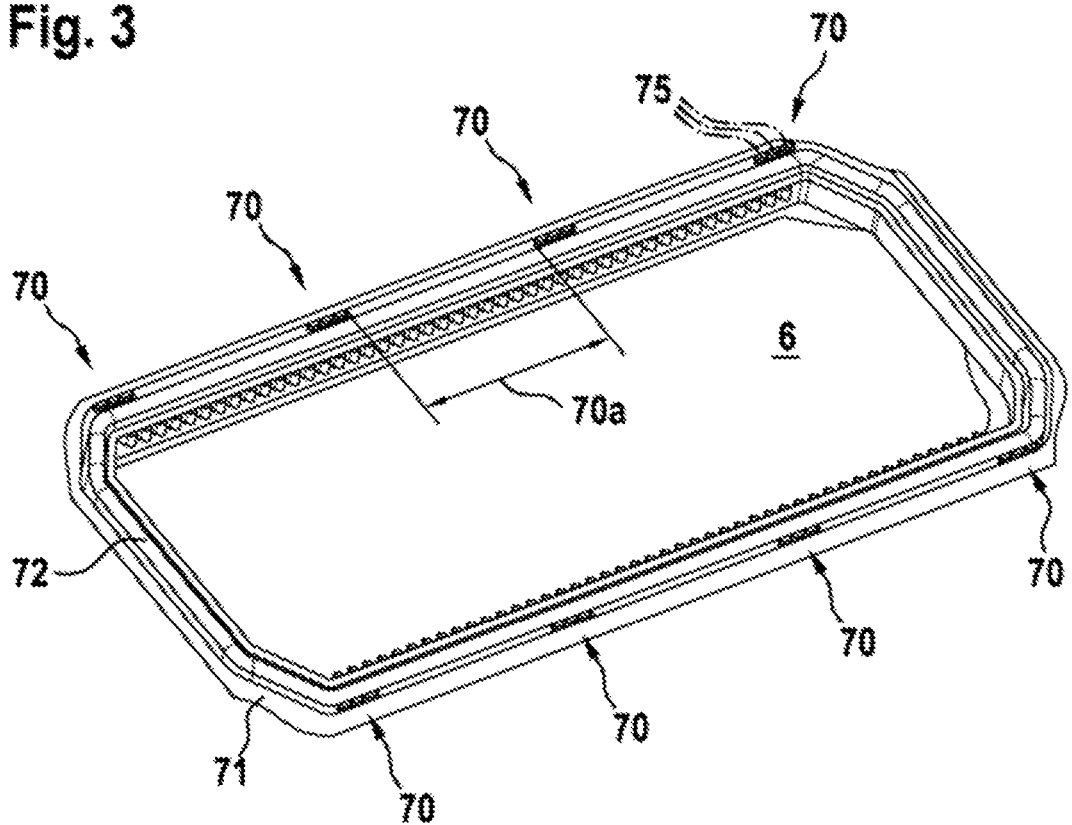
FIG. 3 shows a perspective view of a detail of the electronic arrangement of FIG. 1.
Figure 4:
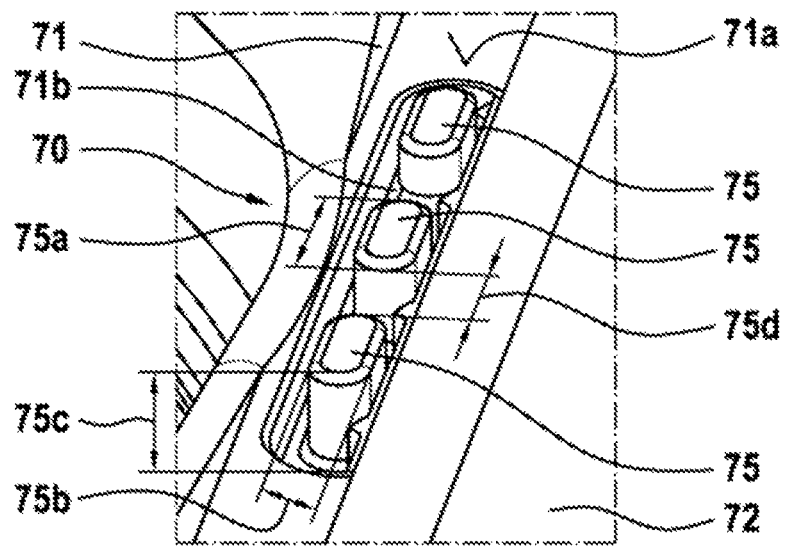
FIG. 4 shows a detail of FIG. 3.

FIG. 1 shows a sectional view of a control unit 100, which comprises an electronic arrangement 1 according to a preferred exemplary embodiment of the invention. FIGS. 2 to 4 depict detailed views of the electronic arrangement 1 of FIG. 1.

The electronic arrangement 1 comprises a base plate 2 and an electronic component 3. A cooling region 6 is formed between the electronic component 3 and the base plate 2. In this case, the cooling region 6 is designed in the form of a gap in order to be able to receive a coolant for cooling the electronic component 3.

The electronic component 3 preferably comprises a cooling device 31, for example in the form of cooling ribs which project into the cooling region in order to enable effective heat removal from the electronic component 3.

The electronic arrangement 1 further comprises a seal arrangement 7, which is arranged between the base plate 2 and the electronic component 3 and which is provided for sealing the cooling region 6. The seal arrangement 7 has a first seal 72, a second seal 73 and a seal carrier 71. The seal carrier 71 holds the two seals 72, 73 in position. Moreover, the seal carrier 71 ensures a minimum spacing between the electronic component 3 and the base plate 2 in order to form the cooling region 6. In this case, the first seal 72 is arranged between the electronic component 3 and the seal carrier 71. The second seal 73 is arranged between the base plate 2 and the seal carrier 71.

A perspective view of the seal carrier 71 with the first seal 72 is depicted in FIG. 3. In this case, the seal carrier 71 and seals 72, 73 are designed to be ring-like, substantially in the form of a rectangular ring, and surround the cooling region 6. In this case, the seal carrier 71 has an H-like cross section (c.f. FIG. 1). In detail, the H-like cross section is formed by two opposing ring grooves 76 in which one of the two seals 72, 73 is received in each case.

The electronic component 3 has a plurality of pins 30, which are arranged on a side of the electronic component 3 which is opposite the base plate 2, and which each extend parallel to a press-in axis 4. The electronic component 3 preferably has a total of 30 pins 30 overall.

Moreover, the electronic arrangement 1 comprises a printed circuit board 5, which is pressed onto the pins 30 of the electronic component 3 along the press-in axis 4. A press connection is therefore established between the printed circuit board 4 and the pins. To produce the press connection, the printed circuit board 4 is pressed onto the pins 30 along the press-in axis 4 with a predefined press-on force 40.

Owing to the construction of the electronic arrangement 1 with the cooling region 6 between the electronic component 3 and base plate 2, it is not possible to support the electronic component 3 directly to provide a holding force opposing the press-on force. The support is therefore realized indirectly in the electronic arrangement 1 according to the preferred exemplary embodiment of the invention.

The indirect support is realized by means of a plurality of press-in domes 75 of the seal carrier 71. In this case, the press-in domes 75 protrude along a direction parallel to the press-in axis 4 and therefore form predefined contact points for the electronic component 3 on the seal carrier 71. In particular, the press-in domes 75 in this case protrude such that the seal carrier 71 may only be in contact with the electronic component 3 via the press-in domes 75.

In order to enable simple assembly and a particularly specific support, the electronic arrangement 1 further comprises a holding plate 8. In this case, the holding plate 8 is designed as a ring-like plate. In this case, the electronic component 3 projects through a central opening 80 of the ring-like holding plate 8.

A flange region 35 of the electronic component 3 is pre-tensioned in the direction of the base plate 2 by means of the holding plate 8. To this end, the base plate 2 has a contact device 20, which extends along a direction of the press-in axis 4 and projects over the seal carrier 71 and the cooling region 6. In this case, the holding plate 8 is connected to the contact device 20 of the base plate 2 in an abutting manner. The connection between the holding plate 8 and the base plate 2 is realized by means of a screw connection. In detail, a screw 21 is screwed into the contact device 20 of the base plate 2 for this purpose.

In this case, dimensions of the holding plate 8, electronic component 3, seal carrier 71, press-in domes 75 and the contact device 20 are matched to one another so that the press-in domes 75 are elastically deformed as a result of the pre-tensioning by means of the holding plate 8, i.e. when the holding plate 8 is screwed to the contact device 20 until it comes to a stop. In addition, a plastic deformation of the press-in domes 75 may be realized here, for example.

In this case, the press-in domes 75 are configured such that all press-in domes 75 together exert a predefined first restoring force on the electronic component 30 in the opposite direction to the press-on force 40. Added to a second restoring force, which results from the two elastically deformed seals 72, 73, this gives a supporting force which acts on the flange region 35 of the electronic component 3, is opposed to the press-on force 40 and whereof the value is greater than or equal to the press-on force 40. This prevents a yielding, in particular of the press-in domes 75, when the printed circuit board 5 is pressed onto the pins 30.

As a result of the specially configured indirect support, the printed circuit board 5 may therefore be pressed onto the pins 30 with the desired press-on force 40, without disadvantageous influences, for example deformations of the relevant devices, impairing the press-on procedure. Desired properties of the press connection between the pin 30 and the printed circuit board 5 may thus be established in a particularly precise and reliable manner.

A geometry of the press-in domes 75 is shown with the aid of FIG. 4. In cross section, each press-in dome 75 in this case has an oval form. Each press-in dome 75 has, in a cross-sectional plane perpendicular to the press-in axis 4, a length to width ratio of two. This means a length 75*a* of the press-in dome 75 corresponds to twice its width 75*b*.

Furthermore, a height 75*c* of each press-in dome 75 along the direction of the press-in axis 4 corresponds substantially to the length 75*a*. In this case, the press-in domes 75 may preferably be arranged in a depression 71*b* of the seal carrier 71 so that the press-in domes 75 project only partly over an upper side 71*a* of the seal carrier 71 along the direction of the press-in axis 4. In this case, the press-in domes 75 preferably only project beyond the upper side 71*a* by 20% of the length 75*a*. Thus, with an optimum configuration of the desired elasticity of the press-in domes 75, a particularly compact geometry of the seal carrier 71, in particular in the axial direction, may be enabled. This enables a particularly space-saving construction of the electronic arrangement 1.

For a particularly specific force distribution and optimum use of the available installation space, multiple press-in domes 75 are grouped together in each case to form a press-in dome group 70. This is depicted in FIGS. 3 and 4, FIG. 4 depicting a detail of FIG. 3 which shows precisely one press-in dome group 70. In this case, each press-in dome group 70 has precisely three mutually adjacent press-in domes 75. In this case, the press-in domes 75 of an individual press-in dome group 70 are arranged at a mutual spacing 75*d* which corresponds approximately to the length 75*a* of an individual press-in dome 75.

As depicted in FIG. 3, a total of eight press-in dome groups 70 are arranged distributed around the circumference of the seal carrier 71. In this case, four press-in dome groups 70 are arranged on each of the two long sides of the rectangular ring which forms the seal carrier 71. In this case, the four press-in dome groups 70 of each long side of the seal carrier 71 are arranged at a predefined mutual spacing 70*a* which corresponds to ten times the spacing 75*d* between the individual press-in domes 75 of each press-in dome group 70.

The invention claimed is:

1. An electronic arrangement, comprising:
    a base plate (2),
    an electronic component (3) having a plurality of pins (30), which each extend parallel to a press-in axis (4),
    a printed circuit board (5), which is pressed onto the pins (30) along the press-in axis (4),
    a cooling region (6), which is formed between the electronic component (3) and the base plate (2), and
    a seal arrangement (7), which is arranged between the base plate (2) and the electronic component (3) and is configured to seal the cooling region (6),
    wherein the seal arrangement (7) has a seal carrier (71) and at least one seal (72),
    wherein the seal carrier (71) has a plurality of press-in domes (75) protruding parallel to the press-in axis (4), and
    wherein the electronic component (3) is supported by the press-in domes (75) of the seal carrier (71) to absorb a press-on force (4) when the printed circuit board (5) is pressed onto the pins (30).

2. The electronic arrangement as claimed in claim 1, further comprising a holding plate (8), which is connected to the base plate (2) and which pre-tensions the electronic component (3) in a direction of the base plate (2).

3. The electronic arrangement as claimed in claim 2, wherein the holding plate (8) is arranged on a side of a sub-region (35) of the electronic component (3) which is opposite the base plate (2), and wherein the base plate (2) has at least one contact device (20), which protrudes parallel to the press-in access (4) and against which the holding plate (8) abuts.

4. The electronic arrangement as claimed in claim 2, wherein the press-in domes (75) are configured such that a sum of a first restoring force of all press-in domes (75) and a second restoring force of the seal (72) is greater than or equal to the predetermined press-on force (40) with which the printed circuit board (3) is pressed onto the pins (30).

5. The electronic arrangement as claimed in claim 1, wherein the seal carrier (71) and the seal (72) surround the cooling region (6) in a ring-like manner.

6. The electronic arrangement as claimed in claim 1, wherein the seal arrangement (7) has first and second seals (72, 73), wherein the first seal (72) is arranged between the seal carrier (71) and the electronic component (3), and wherein the second seal (73) is arranged between the seal carrier (71) and the base plate (2).

7. The electronic arrangement as claimed in claim 1, wherein a plurality of the press-in domes (75) in each case are grouped together to form press-in dome groups (70), and wherein multiple press-in dome groups (70) are arranged distributed around a circumference of the seal carrier (71).

8. The electronic arrangement as claimed in claim 7, wherein each press-in dome group (70) has at least two press-in domes (75), and wherein the seal carrier (71) has at least four press-in dome groups (70).

9. The electronic arrangement as claimed in claim 1, wherein each press-in dome (75) has, in a cross-sectional plane perpendicular to the press-in axis (4), a length to width ratio of at least one.

10. The electronic arrangement as claimed in claim 1, wherein the seal carrier (71) is made of plastic material.

11. The electronic arrangement as claimed in claim 1, wherein the press-in domes (75) are arranged facing the electronic component (3) on the seal carrier (71).

12. A control unit, comprising an electronic arrangement (1) as claimed in claim 1.

13. A method for assembling an electronic arrangement (1), comprising the steps:
    providing a seal arrangement (7) having a seal carrier (71) and at least one seal (72),
    arranging the seal arrangement (7) on a base plate (2),
    arranging an electronic component (3) on a side of the seal arrangement (7) which is opposite the base plate (2),
    pressing a printed circuit board (5) onto a plurality of pins (30) of the electronic component (3) along a press-in axis (4),
    wherein the seal carrier (71) has a plurality of press-in domes (75) protruding parallel to the press-in axis (4), and
    wherein the press-in domes (75) support the electronic component (3) during the pressing-on of the printed circuit board (5) in order to absorb a press-on force (40).

14. The method as claimed in claim 13, further comprising the steps, prior to the pressing-on of the printed circuit board (5):
    arranging a holding plate (8) on a side of a sub-region (35) of the electronic component (3) which is opposite the seal carrier (71), and
    pre-tensioning the electronic component (3) against the base plate (2) by means of the holding plate (8).

15. The method as claimed in claim 14, wherein the electronic component (3) is pre-tensioned against the base plate (2) by means of the holding plate (8) in such a way that the press-in domes (75) of the seal carrier (71) are deformed.

16. The electronic arrangement as claimed in claim 7, wherein each press-in dome group (70) has maximally ten press-in domes (75), and wherein the seal carrier (71) has maximally twelve press-in dome groups (70).

17. The electronic arrangement as claimed in claim 7, wherein each press-in dome group (70) has three press-in domes (75), and wherein the seal carrier (71) has eight press-in dome groups (70).

18. The electronic arrangement as claimed in claim 1, wherein each press-in dome (75) has, in a cross-sectional plane perpendicular to the press-in axis (4), a length to width ratio of maximally five.

19. The electronic arrangement as claimed in claim 1, wherein each press-in dome (75) has, in a cross-sectional plane perpendicular to the press-in axis (4), a length to width ratio of two.

20. The electronic arrangement as claimed in claim 1, wherein the seal carrier (71) is made of polyphenylene sulfide.

\* \* \* \* \*